United States Patent [19]

Tinsley

[11] Patent Number: 4,568,877

[45] Date of Patent: Feb. 4, 1986

[54] REFERENCE FREQUENCY AND LOW VOLTAGE DETECTOR CIRCUIT

[75] Inventor: Timothy M. Tinsley, Coon Rapids, Minn.

[73] Assignee: Honeywell Inc., Minneapolis, Minn.

[21] Appl. No.: 531,989

[22] Filed: Sep. 12, 1983

[51] Int. Cl.⁴ ............................................. G01R 19/00
[52] U.S. Cl. .................................. 324/76 R; 323/266; 323/299; 324/77 A
[58] Field of Search .................................. 340/661–663; 363/89; 323/266, 299, 300; 307/64, 66; 324/76 R, 140 R, 140 D, 77 A

[56] References Cited

U.S. PATENT DOCUMENTS 4,237,405 12/1980 Kellis .................................. 323/299
4,428,020 1/1984 Blanchard ............................ 340/663

*Primary Examiner*—Michael J Tokar
*Attorney, Agent, or Firm*—Charles L. Rubow

[57] ABSTRACT

A reference frequency and low voltage detector circuit for use with a constant frequency A.C. voltage source is disclosed in which a first supply circuit supplies a first voltage wave form having a repetition rate and magnitude proportional to the A.C. source voltage. A second supply circuit supplies a regulated D.C. voltage of a fixed magnitude as long as the amplitude of the A.C. source voltage is normal. The voltages produced by the first and second supply circuits are supplied to noninverting and inverting input terminals of a differential amplifier which produces a rectangular wave output signal only when the A.C. source voltage is normal. The differential amplifier output signal provides a frequency reference under normal conditions and signals a user device to switch to a secondary mode of operation when the repetition rate of the rectangular wave form changes.

5 Claims, 2 Drawing Figures

REFERENCE FREQUENCY AND LOW VOLTAGE DETECTOR CIRCUIT

BACKGROUND OF THE INVENTION

The invention disclosed herein relates generally to circuits for detecting the impending interruption of electrical power required for normal operation of electrically powered devices, and more particularly to a circuit for providing an input signal to a computing device which both serves as a reference frequency and indicates impending interruption of the power required for normal computing device operation.

It is required or desirable in the operation of a variety of electrically powered circuits, devices and equipment that, in the event of primary power failure, operation be terminated in an orderly fashion or continued until a safe condition is reached or at least critical functions be continued under power from an auxiliary source. This is true of computing equipment in which it is both necessary to shut down normal operation in an orderly manner and to provide at least limited electrical power for preserving stored programs and data, among other functions. It is also true of control systems for equipment in connection with which, if normal operation is to be terminated, at least critical functions of the equipment must be controlled to preclude unsafe or otherwise undesirable modes of operation and consequences. For example, if primary electrical power to a control system for controlling the operation of multiple unit air conditioning systems is lost, the control system should remain capable of driving dampers in the air conditioning equipment to safe positions, or if equipment operation is continued, controlling the various units in a coordinated manner to avoid grossly inefficient operation.

Data processing apparatus and control systems for many kinds of equipment include computing devices which provide signals indicative of time of day or other time references. Often, the most readily available and economical source from which such time references can be derived is the alternating voltage which serves as the primary power source for the computing or control equipment.

In general, the functions of detecting impending interruption of primary power and deriving time reference signals from a primary A.C. power source have been performed independently with separate circuitry. The applicant has, however, devised a unique simple reference frequency and low voltage detector circuit which provides a single output from which a computing device can both derive time of day or other time reference and switch to a secondary mode of operation in anticipation of interruption of suitable primary supply power.

SUMMARY OF THE INVENTION

The reference frequency and low voltage detector circuit of the present invention basically comprises first supply means for supplying a first voltage wave form having a fixed repetition rate and a magnitude proportional to that of an A.C. source voltage. A second supply means powered from the first supply means is operable to produce a regulated D.C. voltage in response to a normal voltage from the first supply means. The output voltages of the first and second supply means are supplied to the noninverting and inverting input terminals of a differential amplifier which produces a rectangular wave output signal having a fixed repetition rate only when the normal A.C. supply voltage is present. The differential amplifier may be provided with positive feedback to provide hysteresis so that a higher instantaneous amplitude of the A.C. voltage is required for positive going transitions of the rectangular wave than for negative going transitions thereof.

The output signal from the differential amplifier may be supplied to a computing device which receives its operating power from the second supply means and which is programmed to interpret alteration of the fixed repetition rate rectangular wave form as an indication of impending interruption of the power necessary for normal operation, and thereupon to switch from its primary operating mode to a secondary operating mode.

DESCRIPTION OF THE PREFERRED EMBODIMENT

Figure 1:
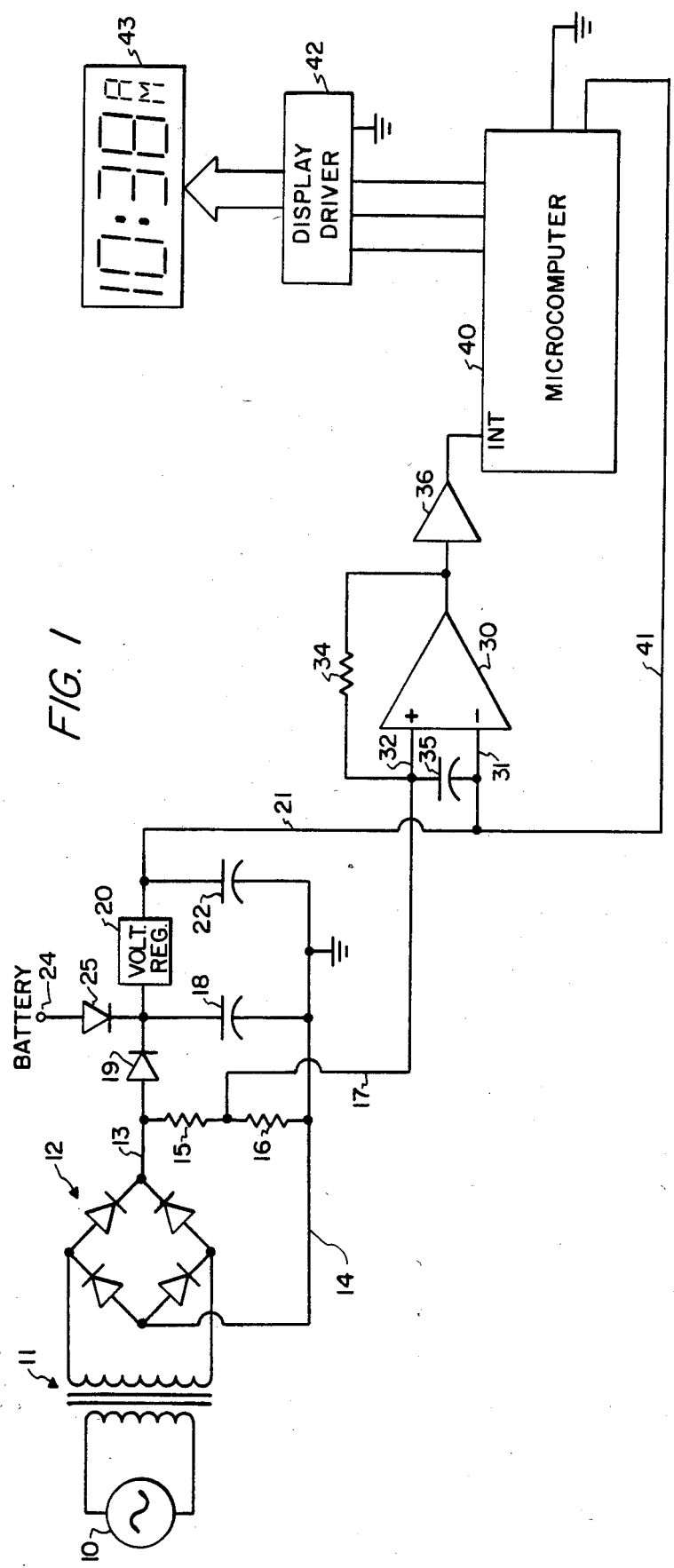
FIG. 1 is a schematic illustration, partly in block diagram form, of a reference frequency and low voltage detector circuit in conjunction with a computing device whose functions include generation of time of day signals in accordance with the applicant's invention.

In FIG. 1, reference numeral 10 identifies a source of fixed frequency alternating current at an established voltage, as supplied by a public utility. This voltage is reduced as appropriate by a transformer 11 and supplied to a full wave rectifier bridge 12. A corresponding rectified, unfiltered voltage is produced between a pair of conductors 13 and 14. A voltage divider comprising resistors 15 and 16 connected in series between conductors 13 and 14 serves to reduce the rectified unfiltered voltage, and to supply the reduced voltage on a conductor 17. The voltage on conductor 17 is represented by wave form (a) in FIG. 2. This voltage wave form is smoothed by a filter capacitor 18 and supplied through a diode 19 to a D.C. power supply 20 which produces a regulated D.C. voltage on a conductor 21. A capacitor 22 between conductor 21 and ground serves to surpress any noise which might be present on the conductor.

The voltage on conductor 21 is regulated at a magnitude required for normal operation of data processing and control equipment powered thereby. Power supply 20 is also connected to receive power from a battery through a terminal 24 and a diode 25 whose cathode is joined to the cathode of diode 19 and the input terminal of the power supply. Diode 19 prevents current drain from the battery through circuit components 11–16 under conditions of low voltage between conductors 13 and 14. Diode 25 prevents current from flowing to the battery under conditions of normal voltage between conductors 13 and 14.

Reference numeral 30 identifies a differential amplifier having an inverting input terminal 31 and a noninverting input terminal 32. Inverting input terminal 31 is connected to receive the output voltage of D.C. power supply 20 which serves as a reference voltage. Noninverting input terminal 32 is connected to receive the rectified unfiltered A.C. voltage on conductor 17.

Figure 2:
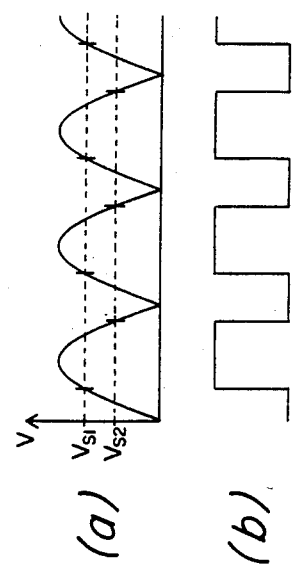
FIG. 2 illustrates certain voltage wave forms and switching levels in the operation of the circuit of FIG. 1.

Differential amplifier 30 produces a rectangular wave output signal illustrated as wave form (b) in FIG. 2. This wave form has the same repetition rate as wave form (a). The output signal of amplifier 30 makes a positive going transition when the amplitude of wave form (a) increases to a predetermined relationship with the voltage on conductor 21. This amplitude is identified by $V_{S1}$ in wave form (a). The output signal of amplifier 30 makes a negative going transition when the amplitude of the rectified unfiltered A.C. voltage falls to a second level identified by $V_{S2}$.

The difference in switching voltages for the positive and negative going portions of the wave form is produced by positive feedback resistor 34 which connects the output of amplifier 30 to its noninverting input terminal 32. The switch points of amplifier 30 are determined by the values of resistors 15, 16 and 34, as well as the reference voltage produced by D.C. power supply 20.

A capacitor 35 is connected between input terminals 31 and 32 of amplifier 30. Capacitor 35 functions as a noise filter, and also introduces a slight delay for stabilizing amplifier operation.

The output signal of amplifier 30 is supplied through a buffer and level shifter 36 to the interrupt port of a microcomputer 40 which is designed for normal operation at the supply voltage produced by D.C. power supply 20. The voltage is supplied to microcomputer 40 over conductor 21 and a further conductor 41.

Microcomputer 40 may be programmed to perform a variety of tasks which it may carry out on a continuous basis. For purposes of the present description, it is assumed that microcomputer 40 is programmed to have primary and secondary operational modes. The primary mode program is carried out for normal microcomputer operation when a normal supply voltage is available, i.e., as long as an A.C. voltage of a normal amplitude is being supplied by source 10. This condition results in the rectangular wave form of FIG. 2(b) being supplied to the interrupt port of microcomputer 40, which the microcomputer interprets as indicating that normal supply voltage is available. However, if the voltage at source 10 drops to the point that the rectified unfiltered A.C. voltage supplied to input terminal 32 of amplifier 30 does not reach level $V_{S1}$, the amplifier and buffer/level shifter 36 remain at their low states. If this condition continues for longer than a predetermined time interval, microcomputer 40 is programmed to enter a special routine which results in a secondary operating mode.

One of the functions performed by microcomputer 40 is illustrated as keeping the time of day. In its primary operating mode, microcomputer 40 derives the time of day signals from the rectangular wave form supplied to interrupt port. The repetition rate of this wave form is determined by the frequency at source 10, which is fixed. Therefore, it can be used to accurately derive time of day or other time references. If the rectangular wave form supplied to the interrupt port of microcomputer 40 ceases as for example on a cold startup or during power failure, the subroutine used during the secondary mode of operation, among other things, keeps time based on a secondary internal time reference.

As shown, signals indicative of time of day are supplied to a display driver 42 which decodes the signals to drive a visual display 43.

In accordance with the foregoing discussion, the applicant has provided a unique circuit and operating technique for a microcomputer for using the same circuit and single microcomputer input port to both serve as a frequency reference and a low voltage detector. Although a particular embodiment has been shown and described for illustrative purposes, other variations and modifications will be apparent to those of ordinary skill in the relevant arts. It is not intended that coverage be limited to the disclosed embodiment, but only by the terms of the following claims.

The embodiments of the invention in which an exclusive property or right is claimed are defined as follows:

1. A reference frequency and low voltage detector circuit for use with a constant frequency A.C. voltage source, comprising:
   first supply means adapted to be energized by a constant frequency A.C. voltage for supplying a first voltage having a periodic wave form at a repetition rate whose ratio with the constant frequency is fixed, and having an amplitude proportional to the amplitude of the A.C. voltage;
   second supply means energized by the first voltage and operable to produce a second D.C. voltage of a substantially fixed first magnitude when the first voltage is of at least a second magnitude; and
   differential amplifier means having noninverting and inverting input terminals connected to receive the first and second voltages respectively, whereby said differential amplifier means produces a rectangular wave output signal of the same repetition rate as the first voltage only when the A.C. voltage source provides a voltage of at least a predetermined amplitude established by said second supply means.

2. The circuit of claim 1 wherein said differential amplifier means includes a positive feedback element between its output terminal and its noninverting input terminal, whereby the rectangular wave output signal has a positive going transition when the instantaneous magnitude of the first voltage increases to a first value, and has a negative going transition when the instantaneous magnitude of the first voltage decreases to a second value less than the first value.

3. The circuit of claim 2 wherein said first supply means includes a rectifier and a voltage divider for producing the first voltage such that it has a repetition rate of twice the frequency of the voltage provided the A.C. voltage source and a peak magnitude less than the peak amplitude of the voltage provided by the A.C. voltage source.

4. The circuit of claim 2 including:
   a computing device requiring a D.C. supply voltage of the first magnitude for normal operation;
   means connecting said computing device to said second supply means so as to receive its D.C. supply voltage therefrom; and
   means connecting said computing device to said differential amplifier so as to receive the rectangular wave output signal therefrom;
   said computing device being programmed to interpret alteration of the repetition rate of the rectangular wave output signal from said differential amplifier as indicative of impending interruption of the D.C. supply voltage of the first magnitude, and to switch from operation in its normal operating mode to operation in a secondary operating mode from a D.C. voltage supplied by an auxiliary source.

5. The circuit of claim 4 wherein said computing device is further programmed to produce signals indicative of time of day using the repetition rate of rectangular wave output signal as a frequency reference when the repetition rate of the rectangular wave output signal is the same as that of the first voltage.

* * * * *